US007001188B2

(12) United States Patent
Kobayashi

(10) Patent No.: US 7,001,188 B2
(45) Date of Patent: Feb. 21, 2006

(54) ELECTRICAL JUNCTION BOX HAVING AN INSPECTION SECTION OF A SLIT WIDTH OF A TUNING FORK-LIKE TERMINAL

(75) Inventor: Nobuchika Kobayashi, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/898,210

(22) Filed: Jul. 26, 2004

(65) Prior Publication Data

US 2005/0032401 A1 Feb. 10, 2005

(30) Foreign Application Priority Data

Aug. 8, 2003 (JP) ............................ 2003-206892

(51) Int. Cl.
*H05K 1/00* (2006.01)

(52) U.S. Cl. ...................................... 439/76.2; 439/910

(58) Field of Classification Search ................ 439/912, 439/76.2, 949, 835, 845, 857, 733.1
See application file for complete search history.

(56) References Cited

U.S. PATENT DOCUMENTS 4,317,609 A * 3/1982 Lapraik .................. 439/733.1
6,589,079 B1 * 7/2003 Kashiyama et al. ........ 439/595

FOREIGN PATENT DOCUMENTS

JP A 2002-112434 4/2002

* cited by examiner

*Primary Examiner*—Briggitte R. Hammond
(74) *Attorney, Agent, or Firm*—Oliff & Berridge, PLC

(57) ABSTRACT

A tuning fork-like terminal is accommodated in a terminal-containing section. The tuning fork-like terminal is provided on the central end with a slit adapted to receive a tab being connected. Clamping portions are projected from the opposed surfaces of the slit to pinch the tab between the clamping portions. A slit gage is inserted into a rectangular terminal hole formed in an end of the terminal-containing section to inspect a slit width between the clamping portions of the tuning fork-like terminal. A wide hole portion is formed in the rectangular terminal hole at the insertion position of the slit gage. The wide hole portion is formed by widening a length of a short side of the rectangular terminal hole. The central position of the slit in the tuning fork-like terminal and the central position of the slit gage coincide with each other, even if the tuning fork-like terminal is maximally shifted from the central position in the terminal-containing section, whereby the slit width can be precisely inspected to precisely inspect a slit width in a tuning fork-like terminal accommodated in a terminal-containing section of an electrical junction box.

2 Claims, 9 Drawing Sheets

ELECTRICAL JUNCTION BOX HAVING AN INSPECTION SECTION OF A SLIT WIDTH OF A TUNING FORK-LIKE TERMINAL

CLAIM FOR PRIORITY

This invention relates to subject-matter contained in and claims priority to JP 2003-206892, filed on Aug. 8, 2003, the entire disclosure of which is incorporated herein by reference thereto.

BACKGROUND OF THE INVENTION

1. Field of Invention

This invention relates to an electrical junction box having an inspection section for inspecting a slit width of a tuning fork-like terminal and more particularly relates to an electrical junction box that can inspect a slit width of a tuning fork-like terminal without misjudging even if the tuning fork-like terminal is shifted in a terminal-containing section of the electrical junction box.

2. Description of Related Art

Heretofore, in an electrical junction box such as a junction box to be mounted on an automobile vehicle, a terminal is received in a terminal-containing section of the electrical junction box, a tab of a relay or a fuse is inserted into a terminal hole formed in the terminal-containing section to mount the relay or fuse on the terminal-containing section, and the tab is coupled to a terminal in the terminal-containing section.

A tuning fork-like terminal is utilized as a terminal to be accommodated in the terminal-containing section. The tab is inserted into a slit in the tuning fork-like terminal to make an electrical connection. Applicant has disclosed the electrical junction box as constructed above in Japanese Patent Public Disclosure No. 2002-112434.

To be more specific, as shown in FIG. 7 and FIG. 8A, a relay-containing section 1 is provided in the end wall with terminal holes 1*a* for receiving terminals (tabs) 5 of relays. Tuning fork-like terminals 3 projecting from bus bars 2 are accommodated in the relay-containing section 1. The tuning fork-like terminal 3 is provided in the central end with a slit 3*a*. A clamping portion 3*b* is formed on a longitudinal intermediate part of each of opposed walls of the slit 3*a*. When the tab 5 of the relay is inserted downward into the terminal hole 1*a*, the tab 5 is pushed into the slit 3*a* through a space defined between the clamping portions 3*b*, and electrical connection is made by a friction contact between the opposite sides of the tab 5 and the outer surfaces of the clamping portions 3*b*.

An external force may deform the tuning fork-like terminal when the terminal is transported or assembled to the terminal-containing section of the electrical junction box. If a distance between the clamping portions 3*b* is widened on account of a deformation of the tuning fork-like terminal, a failure in contact may be caused between a tab of a relay or a fuse and the tuning fork-like terminal. If the distance is narrowed reversely, the tab cannot pass the space between the clamping portions 3*b*. If the tab is forcedly inserted into the terminal hole, the tuning fork-like terminal will be deformed, thereby causing a failure in contact.

As shown in FIG. 8B, a slit gage 4 is inserted into the terminal hole la after the tuning fork-like terminal 3 is accommodated in the terminal-containing section to previously inspect whether or not the turning fork-like terminal 3 maintains the specified width L4 between the clamping portions 3*b*. The slit gage 4 includes a wide portion 4*a* and a narrow portion 4*b* with the specified width L4 disposed below the wide portion 4*a*. If the distance between the clamping portions 3*b* is equal to the specified width L4, only the narrow portion 4*b* passes the space between the clamping portions 3*b* and the wide portion 4*a* cannot pass the space.

SUMMARY OF THE INVENTION

However, in the above inspection method, if the tuning fork-like terminal 3 is shifted in the terminal-containing section, as shown in FIGS. 9A and 9B, that is, if the center of the slit 3*a* in the tuning fork-like terminal 3 is shifted from the center of the slit gage 4 and one (3*b*-1) of the clamping portions 3*b* does not project over one (1*a*-1) of inner surfaces of the terminal hole 1*a*, an end surface of the wide portion 4*a* of the slit gage 4 will contact with the inner surface 1*a*-1 upon insertion of the slit gage 4 into the slit 3*a* while the other end surface of the slit gage 4 will contact with the other (3*b*-2) of the clamping portions 3*b*. Consequently, the slit gage cannot advance further into the terminal hole 1*a* at the clamping portions 3*a*. This may bring the inspection into a misjudgment that the distance between the clamping portions 3*b* is equal to the specified width L4, even if the distance is greater than the specified width L4.

When causing such misjudgment, there are problems of causing a failure in contact upon insertion of a tab of a relay or a fuse into a slit in a tuning fork-like terminal.

In view of the above problems, an object of the invention is to precisely carry out an inspection of a slit width in a tuning fork-like terminal and eliminate misjudgment, even if the tuning fork-like terminal is shifted in a terminal-containing section.

In order to overcome the above problems, the invention provides an electrical junction box having an inspection section for inspecting a slit width of a tuning fork-like terminal. In the electrical junction box, a tuning fork-like terminal is accommodated in a terminal-containing section. The tuning fork-like terminal is provided on the central end with a slit adapted to receive a tab being connected. Clamping portions are projected from the opposed surfaces of the slit to pinch the tab between the clamping portions. A slit gage is inserted into a rectangular terminal hole formed in an end of the terminal-containing section to inspect a slit width defined between the clamping portions of the tuning fork-like terminal.

The inspection section includes a wide hole portion formed in the rectangular terminal hole at the insertion position of the slit gage. The wide hole portion is formed by widening a length of a short side of the rectangular terminal hole. The central position of the slit in the tuning fork-like terminal and the central position of the slit gage coincide with each other, even if the tuning fork-like terminal is maximally shifted from the central position in the terminal-containing section, whereby the slit width can be precisely inspected.

A width of the wide hole portion is set to be a dimension in which the clamping portions of the tuning fork-like terminal can be located below the wide hole portion in a vertical direction when the tuning fork-like terminal is maximally shifted in the terminal-containing section.

According to the above structure, because the terminal hole for receiving a tab of a relay or a fuse has a wide hole portion at the insertion position of the slit gage, even if the tuning fork-like terminal is shifted in the housing when contained therein, the opposite side surfaces of the tuning fork-like terminal are not constrained at the inner contact surfaces of the terminal hole and the central position of the slit in the tuning fork-like terminal and the central position of the slit gage coincide with each other, thereby enabling the slit gage to advance into the slit in the tuning fork-like terminal.

Accordingly, when only the narrow portion of the slit gage passes the space defined between the clamping portions and the wide portion of the slit gage stops advancing at the clamping portions, it is possible to conclude that the slit width is equal to the specified width. When the wide portion of the slit gage passes the space defined between the clamping portions, it is possible to conclude that the slit width is greater than the specified width. That is, it is possible to eliminate misjudgment that the slit width is equal to the specified width, when the narrow portion of the slit gage is pinched between the inner surface of the terminal hole and one of the clamping portions and stops advancing into the slit.

Thus, because it is possible to precisely inspect the slit width of the tuning fork-like terminal accommodated in the terminal-containing section, it is possible to enhance reliability in electrical connection between a tuning fork-like terminal and a tab of a relay or a fuse. Thus, the terminal hole serves to receive a terminal of a relay or a fuse.

Many tuning fork-like terminals described above can be utilized as a terminal to be connected to a tab of a relay or a fuse. Because the tuning fork-like terminals are readily formed on a projecting part of a bus bar, it is possible to couple the tuning fork-like terminal to the tab of the relay or the fuse without connecting a relay female terminal to a tab projecting from a bus bar as done in the prior art.

DETAILED DESCRIPTION OF EXEMPLARY EMBODIMENTS

Figure 1:
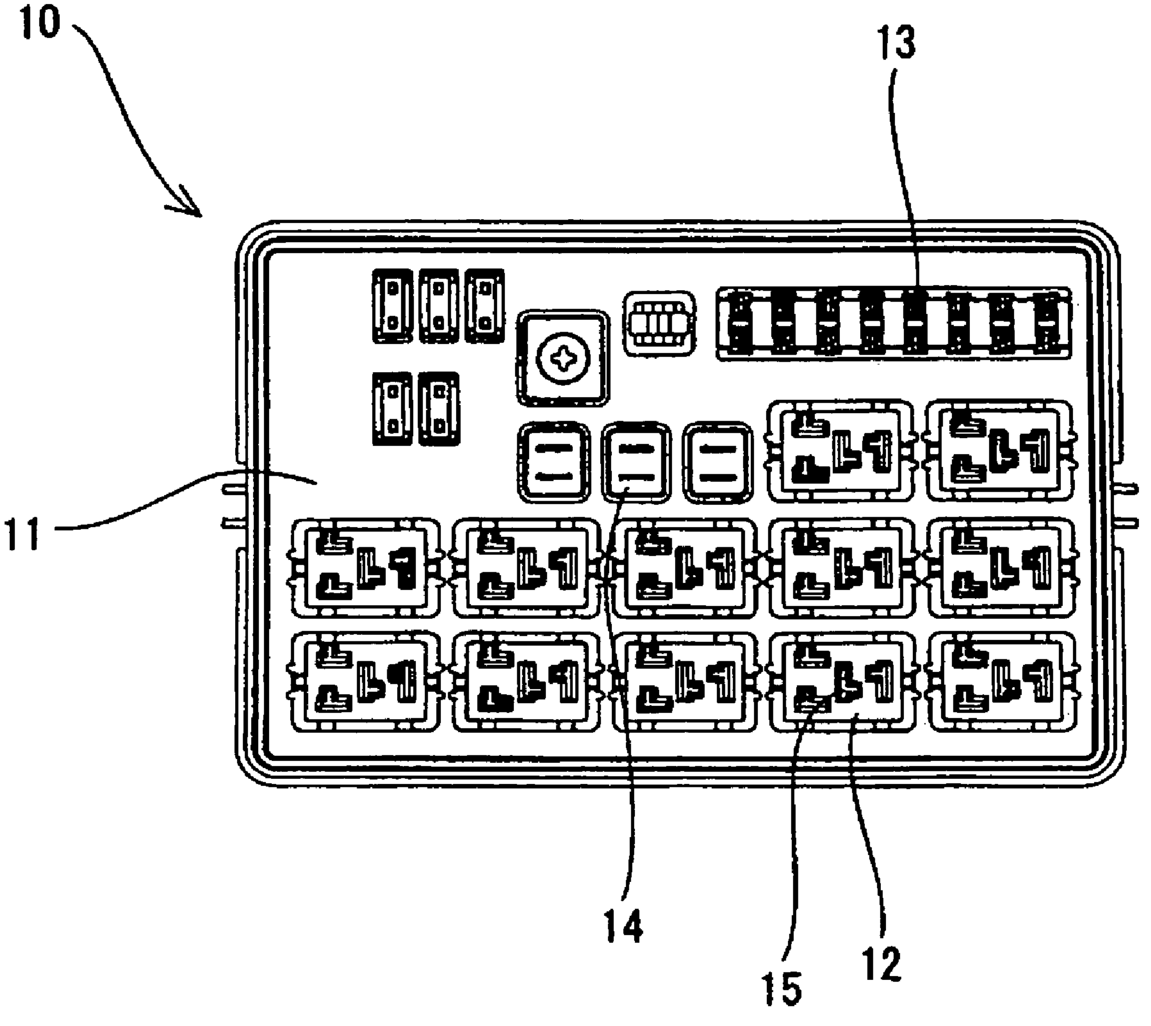
FIG. 1 is a plan view of an embodiment of an electrical junction box in accordance with the invention.

Referring now to the drawings, an embodiment of an electrical junction box in accordance with the invention will be described below.

Figure 2A:
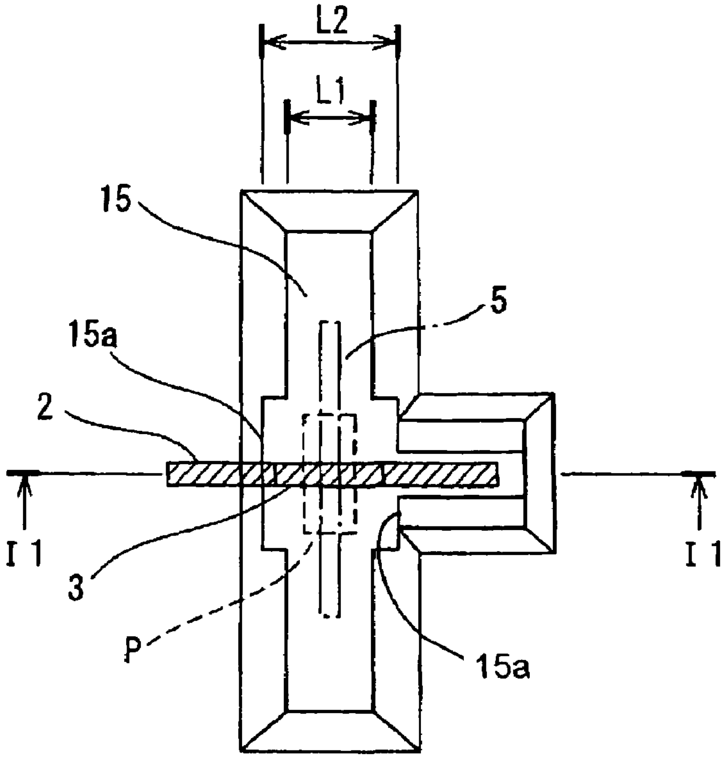
FIG. 2A is an enlarged plan view of a main part of a terminal hole.
Figure 2B:
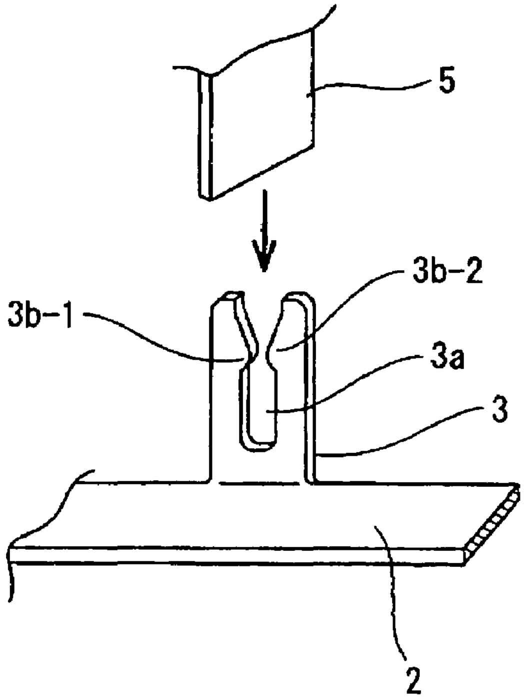
FIG. 2B is a perspective view of a tuning fork-like terminal accommodated in a terminal-containing section, illustrating a connection condition between the terminal and a tab.

FIG. 1 shows a plan view of an electrical junction box 10. A plurality of relay-containing sections 12, fuse-containing sections 13, and fusible link-containing sections 14 are accommodated in an upper casing 11. FIG. 2 is an enlarged plan view of a main part of a terminal hole 15 in the relay-containing section 12.

An area shown by diagonal lines in FIG. 2 illustrates a position where a tuning fork-like terminal 3 should be located in a housing 16 (see FIG. 3) of the relay-containing section 12. Bending an end of a bus bar 2 forms the tuning fork-like terminal 3. The tuning fork-like terminal 3 is provided in the central end with a slit 3*a*. Clamping portions 3*b* (3*b*-1, 3*b*-2) are formed on longitudinal intermediate parts of the opposed surfaces of the slit 3*a*. A distance between the clamping portions 3*b*-1 and 3*b*-2 is set to be a specified dimension in width (specified width) L4.

The terminal hole 15 is formed into a rectangular shape extending in an orthogonal direction relative to the tuning fork-like terminal 3. The tab 5 of the relay is inserted into the terminal hole 15 in an orthogonal direction relative to the tuning fork-like terminal 3.

A wide hole portion 15*a* is formed in the terminal hole 15 at the insertion position of the slit gage corresponding to the location P of the tuning fork-like terminal 3 by widening a length of a short side of the terminal hole 15 so that the wide hole portion 15*a* has a width L2 greater than a width L1 of the short side of the terminal hole 15.

The width L2 of the wide hole portion 15*a* greater than the width L1 is set so that the clamping portions 3*b* (3*b*-1, 3*b*-2) can project over the inner surfaces of the terminal hole 15 into the wide hole portion 15*a*, even if the tuning fork-like terminal 3 is shifted maximally in the housing 16 of the terminal-containing section, that is, even if an inner surface of the housing 16 contacts with an end edge of the tuning fork terminal 3.

Figure 3:
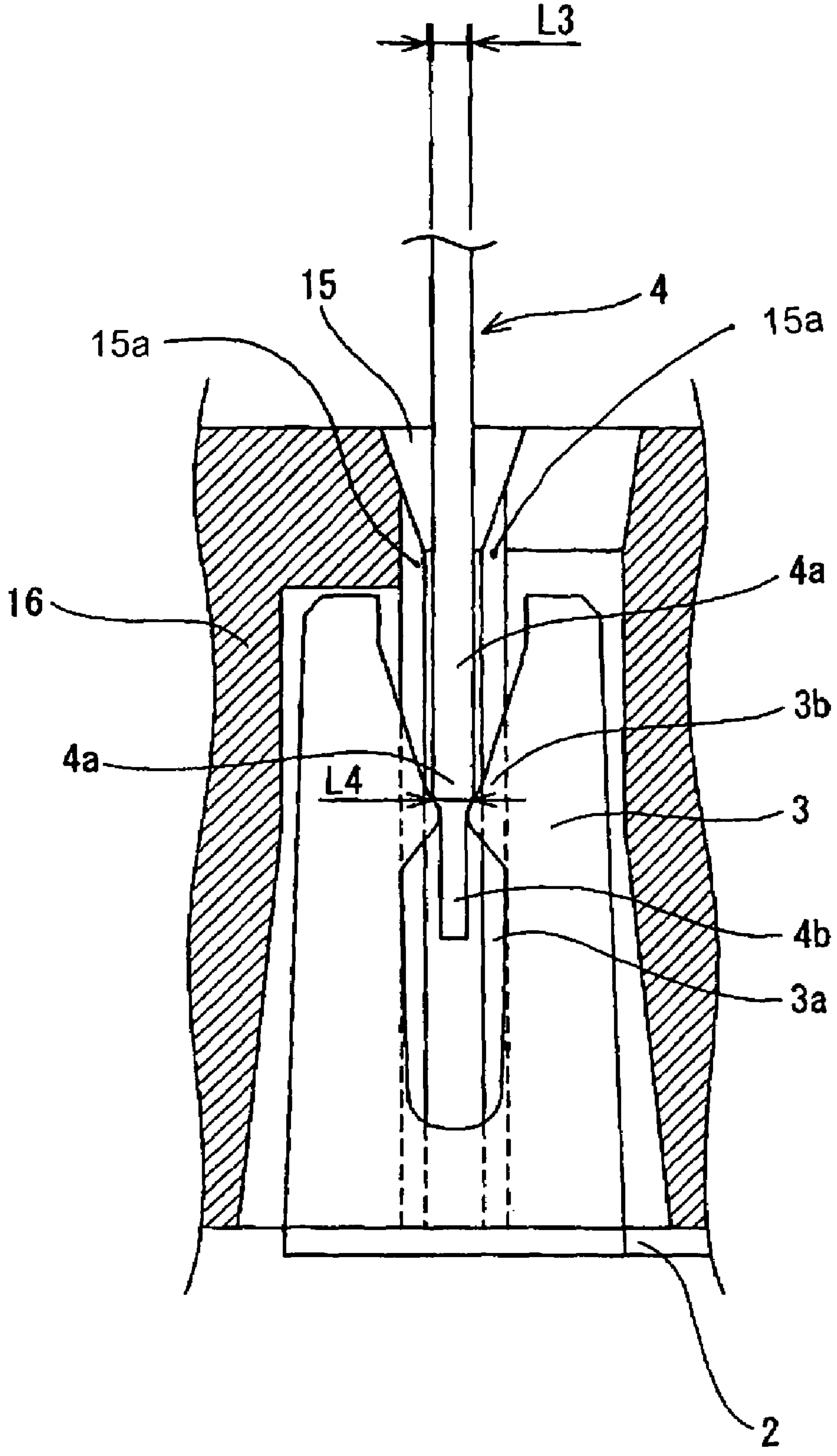
FIG. 3 is a sectional view of the terminal hole taken along line I1—I1 in FIG. 2A, illustrating a slit gage inserted through the terminal hole into the tuning fork-like terminal.

The slit gage 4 that inspects a dimension between the clamping portions 3*b* of the tuning fork-like terminal 3 has the same configuration described above. As shown in FIG. 3, the slit gage 4 includes a wide portion 4*a* with a width L3 and a narrow portion 4*b* with a width L4 below the wide portion 4*a*.

The inspection method of inspecting a slit width of the tuning fork-like terminal 3 is the same one described above. As shown in FIG. 3, the slit gage 4 is inserted through the terminal hole 15 into the slit 3*a* in the tuning fork-like terminal 3 until the wide portion 4*a* of the slit gage 4 is stopped by the clamping portions 3*b*. When only the narrow portion 4*b* of the slit gage 4 is passed through the space between the clamping portions 3*b*, a width between the clamping portions 3*b* is concluded to be equal to a specified width L4.

Figure 4:
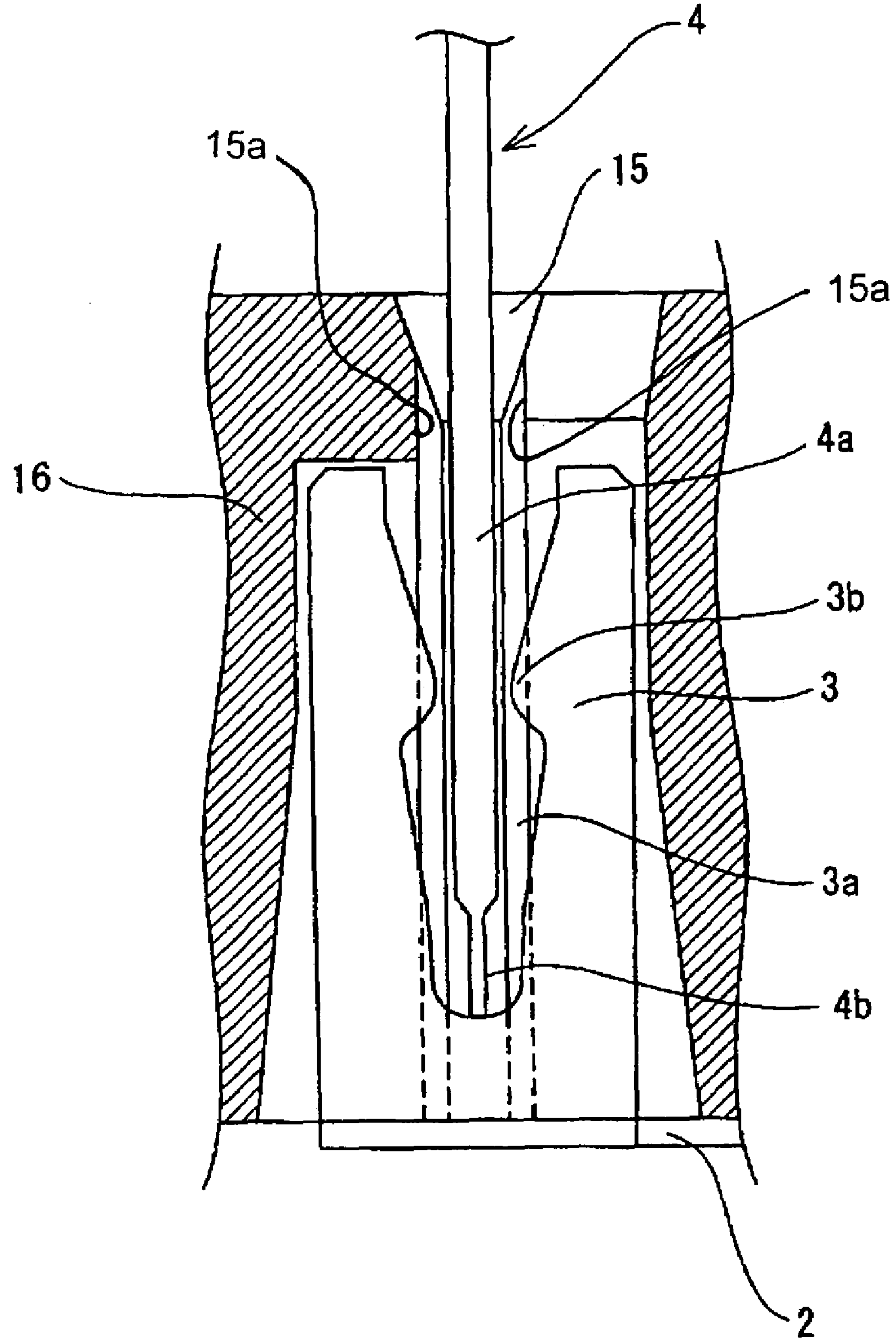
FIG. 4 is a sectional view similar to FIG. 3, illustrating the slit gage inserted through the terminal hole into the tuning fork-like terminal a slit of which is widened.
Figure 5:
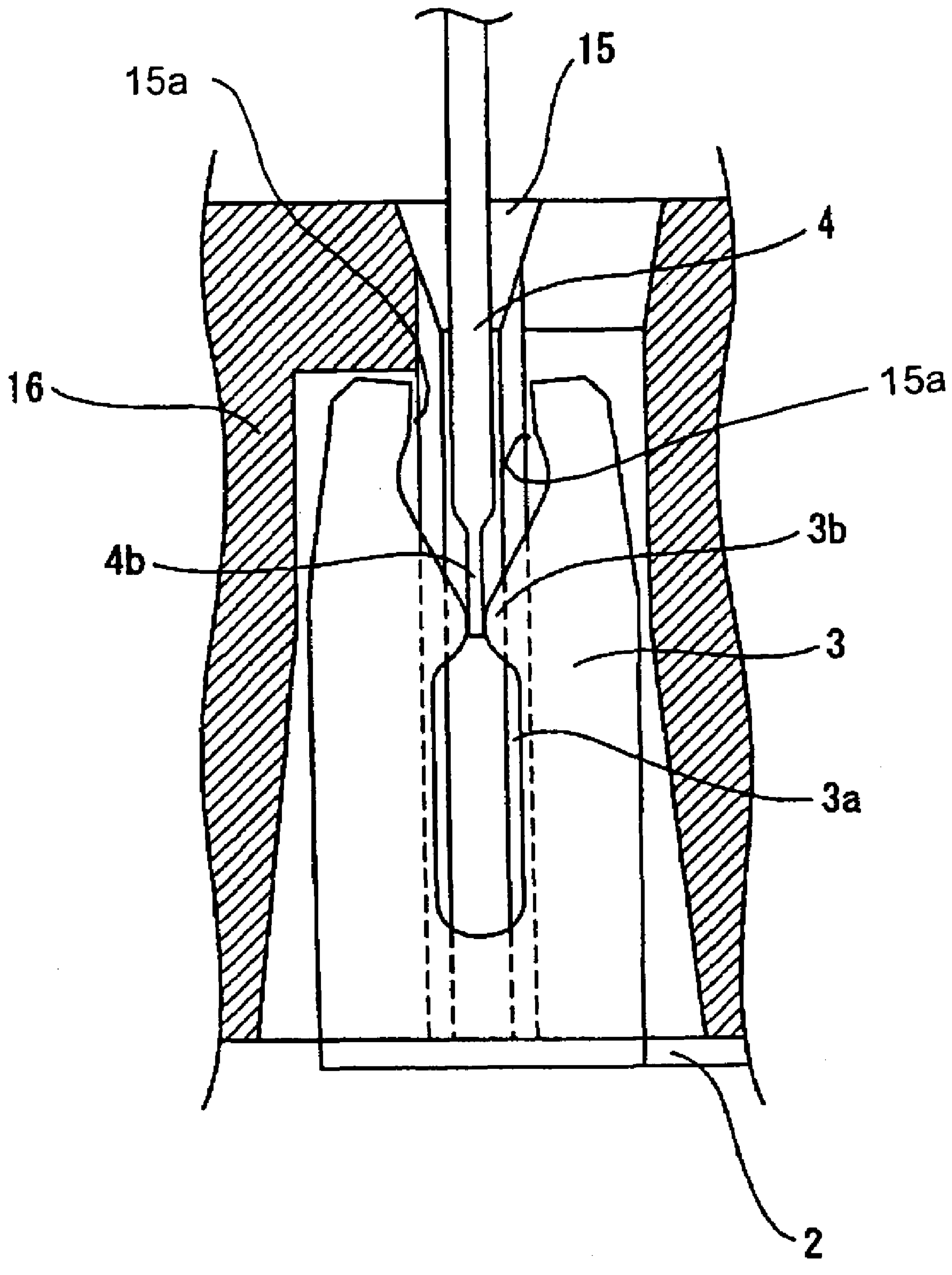
FIG. 5 is a sectional view similar to FIG. 3, illustrating the slit gage inserted through the terminal hole into the tuning fork-like terminal a slit of which is narrowed.

On the other hand, as shown in FIG. 4, if the distance between the clamping portions 3*b* is wider than the specified width L4, the wide portion 4*a* of the slit gage 4 passes through the space between the clamping portions 3*b* and advances to an inner part until the distal end of the narrow portion 4*b* contacts the bottom of the slit 3*a*. At this time, the distance between the clamping portions 3*b* is concluded to be wider than the specified width L4. If the distance between the clamping portions 3*b* is narrower than the specified width L4, as shown in FIG. 5, the narrow portion 4*b* of the slit gage 4 cannot pass through the space between the clamping portions 3*b*. Thus, the distance is concluded to be narrower than the specified width L4.

The method of inspecting a width of a slit in the tuning fork-like terminal 3 using the slit gage 4 is based on a precondition that the center of the slit gage 4 accords with the center of the slit 3*a* in the tuning fork-like terminal 3.

Figure 6A:
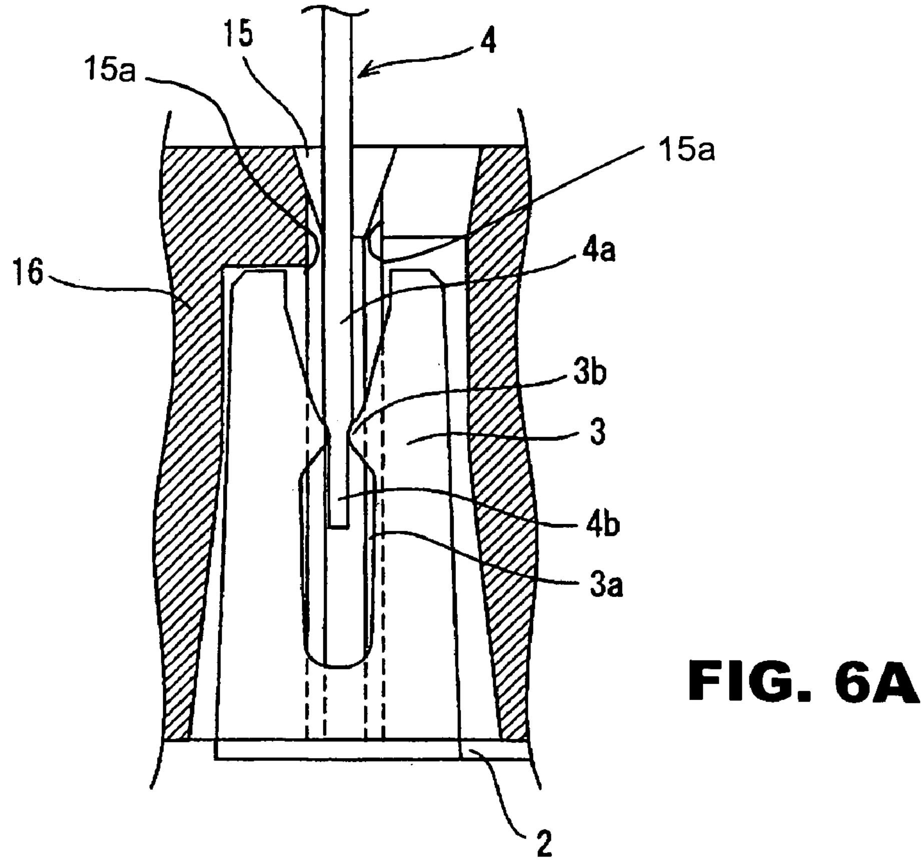
FIGS. 6A and 6B are sectional views similar to FIG. 3, illustrating the slit gage inserted through the terminal hole into the tuning fork-like terminal shifted in a terminal-containing section.
Figure 6B:
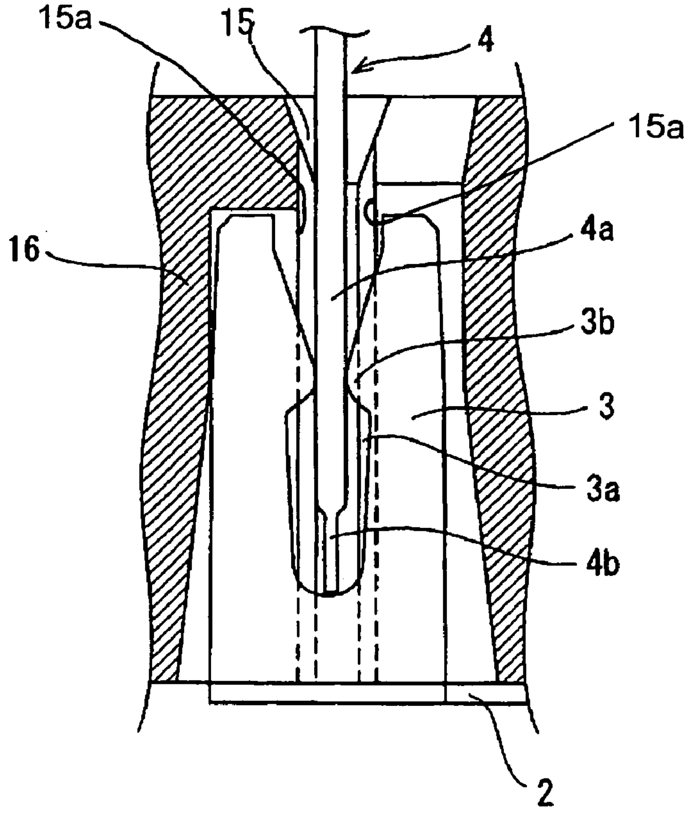
Figure 7:
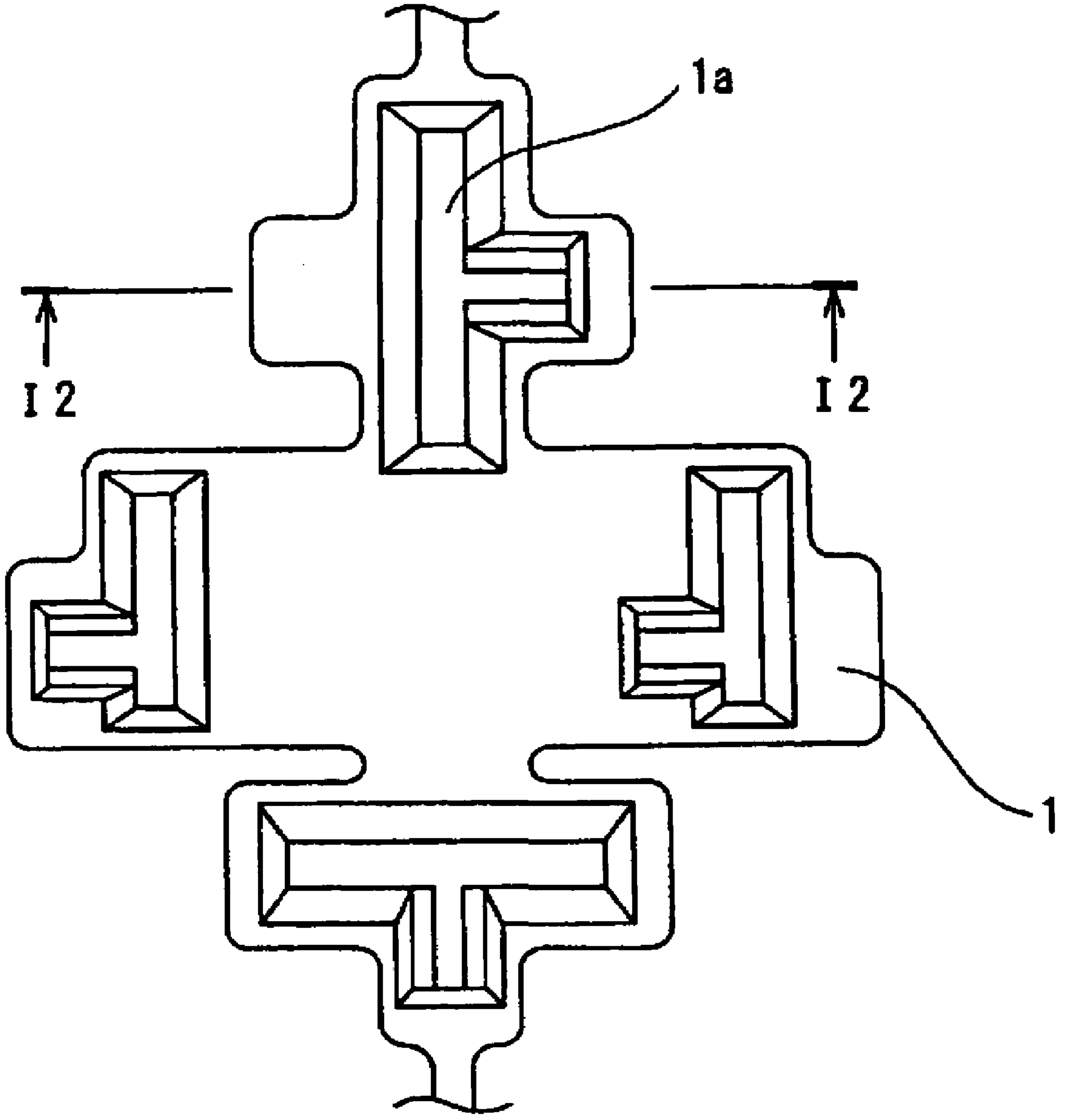
FIG. 7 (Related Art)
FIG. 7 is a plan view of terminal holes in a conventional relay-containing section.
Figure 8A:
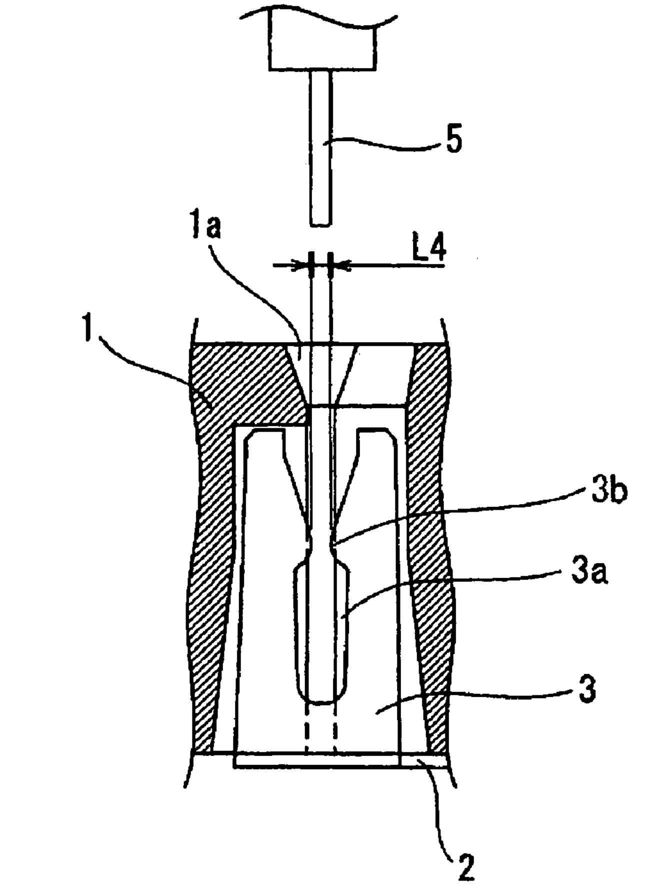
FIG. 8A (Related Art)
FIG. 8A is a sectional view of the conventional relay-containing section.
Figure 8B:
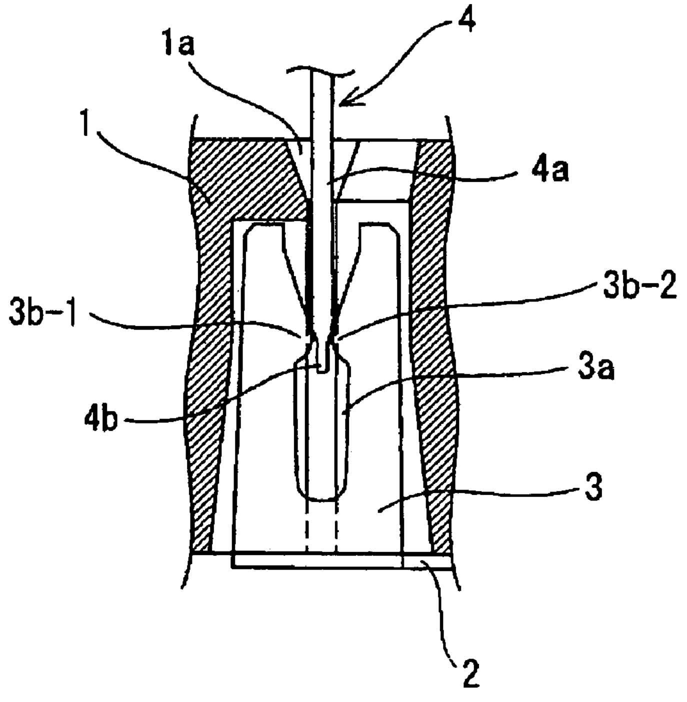
FIG. 8B (Related Art)
FIG. 8B is a sectional view similar to FIG. 8A, illustrating a conventional inspection method for a slit width of a tuning fork-like terminal using a slit gage.
Figure 9A:
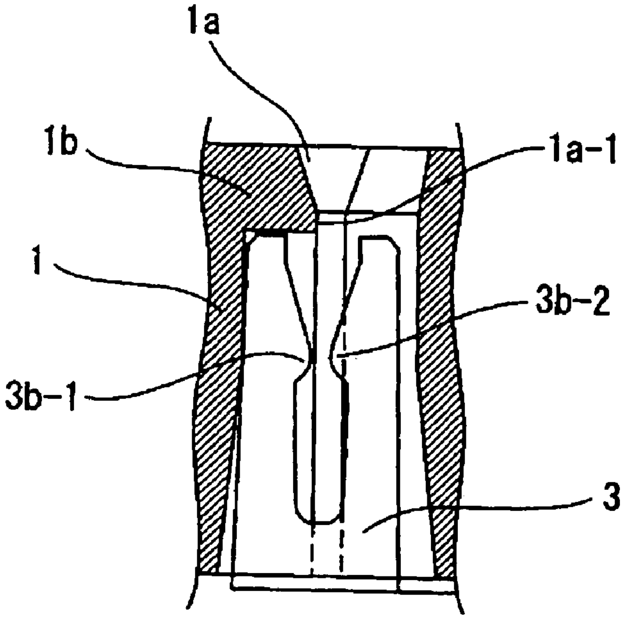
FIG. 9A (Related Art)
FIGS. 9A and 9B are sectional views similar to FIGS. 8A and 8B, respectively, illustrating misjudgment conditions of a slit width of the tuning fork-like terminal shifted in the relay-containing section.
Figure 9B:
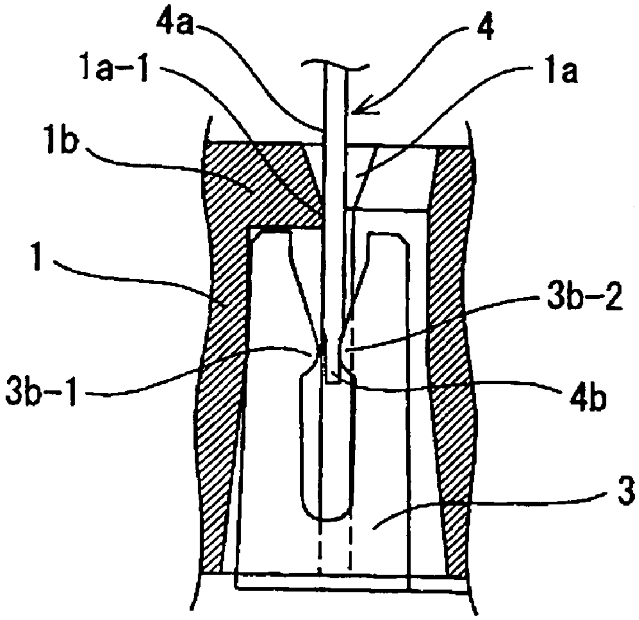
FIG. 9B (Related Art)

When the tuning fork-like terminal 3 is shifted in the housing 16 of the relay-containing section 12, as shown in FIGS. 6A and 6B, even if the tuning fork-like terminal 3 is maximally shifted to contact with the one inner surface of the housing 16, the clamping portion 3*b*-1 of the tuning fork-like terminal 3 can project over the same line on the inner surface of the wide hole portion 15*a* at the vertical lower end, because the terminal hole 15 has a wide hole portion 15*a* at the insertion position of the slit gage 4.

Accordingly, it is possible to insert the slit gage 4 into the terminal hole 15 with the center of the slit gage 4 coinciding with the center of the distance between the clamping portions 3*b*-1 and 3*b*-2.

As described above, because the slit gage 4 can be inserted into the terminal hole 15 while centering the slit 3*a* in the tuning fork terminal 3 and the slit gage 4, even if the tuning fork-like terminal 3 is shifted in the housing 16, it is possible to precisely determine whether or not the dimension between the clamping portions 3*b* of the tuning fork-like terminal 3 is set to be the specified width L4, as described by referring to FIGS. 3 to 5.

That is, as shown in FIG. 6A, even if the tuning fork-like terminal 3 is shifted maximally in the housing, because the clamping portion 3*b*-1 projects in the wide hole portion 15*a* at the lower part, only the narrow portion 4*b* of the slit gage 4 passes the space between the clamping portions 3*b* when the dimension between the clamping portions 3*b*-1 and 3*b*-2 is equal to the specified width L4 and the wide portion 4*a* stops advancing.

On the other hand, as shown in FIG. 6B, in the case where the distance between the clamping portions 3*b* is greater than the specified width L4, the wide portion 4*a* of the slit gage 4 passes the space between the clamping portions 3*b*, thereby detecting a deformation of the clamping portions 3*b*.

Thus, it is possible to precisely measure a slit width between the clamping portions 3*b* of the tuning fork-like terminal 3 and to eliminate misjudgment merely by providing the wide hole portion 15*a* at the insertion position of the slit gage 4 in the terminal hole 15, even if the tuning fork-like terminal 3 is shifted in the housing 16.

Although the wide hole portion is provided in the terminal hole in the relay-containing section in the above embodiment, the wide hole portion may be provided in the terminal hole in the fuse-containing section that accommodates the tuning fork-like terminal to surely carry out the inspection of the slit width of the tuning fork-like terminal using the slit gage.

It will be apparent from the foregoing that according to the invention, in an electrical junction box in which a tuning fork-like terminal to be connected to a tab of a relay, a fuse, or the like is accommodated in a terminal-containing section of the box and a slit gage inspect whether or not a slit width of the tuning fork-like terminal is equal to the specified width, a wide hole portion is formed in a terminal hole provided in the end of the terminal-containing section at the insertion position of the slit gage corresponding to the location of the tuning fork-like terminal.

Thus, it is possible to insert the slit gage through the wide hole portion into the slit in the tuning fork-like terminal while the central position of the slit gage coincides with the central position of the slit in the tuning fork-like terminal, even if the tuning fork-like terminal is shifted in the terminal-containing section. Consequently, the slit gage does not misjudge the slit width between the clamping portions and can precisely inspect the slit width, even if the tuning fork-like terminal is shifted in the terminal-containing section.

Although the invention has been described with reference to particular means, materials and exemplary embodiments, it is to be understood that the invention is not limited to the particulars disclosed and extends to all equivalents within the scope of the claims. It is evident that many alternatives, modifications, and variations will be apparent to those skilled in the art in light of the foregoing description. It is therefore contemplated that the appended claims will embrace any such alternatives, modifications, and variations as falling within the true scope and spirit of the invention.

What is claimed is:

1. An electrical junction box comprising:

a tuning fork terminal accommodated in a terminal-containing section, the tuning fork terminal disposed on a central end with a slit adapted to receive a tab being connected;

clamping portions projected from opposed surfaces of the slit to pinch the tab between the clamping portions;

a slit gage inserted into a rectangular terminal hole formed in an end of the terminal-containing section to inspect a slit width between the clamping portions of the tuning fork terminal; and an inspection section for inspecting a slit width of the tuning fork terminal, the inspection section including a wide hole portion formed in the rectangular terminal hole at an insertion position of the slit gage, the wide hole portion being formed by widening a length of a short side of the rectangular terminal hole to enable precisely determining whether the slit width between the clamping portions is a specified width, a central position of the slit in the tuning fork terminal and a central position of the slit gage coinciding with each other, even if the tuning fork terminal is maximally shifted from a central position in the terminal-containing section, and whereby the slit width can be precisely inspected.

2. The electrical junction box according to claim 1, wherein a width of the wide hole portion is set to be a dimension in which the clamping portions of the tuning fork terminal can be located below the wide hole portion in a vertical direction when the tuning fork terminal is maximally shifted in the terminal-containing section.

* * * * *